(12) United States Patent
Chan et al.

(10) Patent No.: US 8,350,370 B2
(45) Date of Patent: Jan. 8, 2013

(54) WIDE ANGLE OVAL LIGHT EMITTING DIODE PACKAGE

(75) Inventors: Chi Keung Chan, Sheung Shui (HK); Zhang Zhikuan, Shatin (HK); Yue Kwong Lau, Laguna (HK); Hao Liu, Huizhou (CN); Xiang Fei, Huizhou (CN); Meigui Luo, Huizhou (CN); Juzuo Sheng, Huizhou (CN)

(73) Assignee: Cree Huizhou Opto Limited, Huizhou Municipality, Guangdong Province (CN)

( * ) Notice: Subject to any disclaimer, the term of this patent is extended or adjusted under 35 U.S.C. 154(b) by 343 days.

(21) Appl. No.: 12/657,935

(22) Filed: Jan. 29, 2010

(65) Prior Publication Data
US 2011/0186865 A1 Aug. 4, 2011

(51) Int. Cl.
*H01L 23/495* (2006.01)
(52) U.S. Cl. ...... 257/676; 257/81; 257/99; 257/E25.032
(58) Field of Classification Search .................. None
See application file for complete search history.

(56) References Cited

U.S. PATENT DOCUMENTS

| | | | |
|---|---|---|---|
| 4,946,547 A | 8/1990 | Palmour et al. | 156/643 |
| 5,200,022 A | 4/1993 | Kong et al. | 156/612 |
| RE34,861 E | 2/1995 | Davis et al. | 437/100 |
| 6,061,160 A | 5/2000 | Maruyama | 359/152 |
| 6,259,608 B1 | 7/2001 | Berardinelli et al. | |
| 6,296,367 B1 | 10/2001 | Parsons et al. | 362/183 |
| 6,359,236 B1 | 3/2002 | DiStefano et al. | |
| 6,376,902 B1 | 4/2002 | Arndt | 257/678 |
| 6,642,547 B2 | 11/2003 | Matsubara et al. | 257/98 |
| 6,710,373 B2 | 3/2004 | Wang | |
| 6,770,498 B2 | 8/2004 | Hsu | 438/26 |
| 6,995,510 B2 | 2/2006 | Murakami et al. | |
| 7,021,797 B2 | 4/2006 | Minano et al. | 362/355 |
| 7,119,422 B2 | 10/2006 | Chin | 257/666 |
| 7,213,940 B1 | 5/2007 | van de Ven | 362/231 |

(Continued)

FOREIGN PATENT DOCUMENTS
CN 2809880 Y 8/2006
(Continued)

OTHER PUBLICATIONS

Nichia Corp. White LED Part No. NSPW300BS Specification, Jan. 14, 2004.

(Continued)

*Primary Examiner* — Benjamin Sandvik
*Assistant Examiner* — Scott R Wilson
(74) *Attorney, Agent, or Firm* — Koppel, Patrick, Heybl & Philpott

(57) ABSTRACT

The present invention is directed to LED packages and LED displays utilizing LED packages where the peak emission of the LED displays can exhibit improved emission characteristics. In some embodiments the improved characteristics include a wider horizontal emission angle for the LED packages according to the present invention, which results in improved emission characteristics for the LED display such as a wider far field pattern. This provides improved picture intensity and quality when viewing the display at different horizontal viewing angles. Different embodiments also provide for improved emission characteristics for LED packages emitting different colors of light when viewing at different vertical angles. In one embodiment the red and green LED packages can have emission patterns that are substantially the same at different vertical viewing angles within a range. This helps the colors of the display appear consistent at those angles.

35 Claims, 7 Drawing Sheets

U.S. PATENT DOCUMENTS

| | | | |
|---|---|---|---|
| 7,224,000 | B2 | 5/2007 | Aanagola et al. ............... 257/98 |
| D572,670 | S | 7/2008 | Ono et al. .................... D13/180 |
| D576,574 | S | 9/2008 | Kobayakawa ............... D13/180 |
| 2002/0061174 | A1 | 5/2002 | Hurt et al. |
| 2003/0183852 | A1 | 10/2003 | Takenaka |
| 2004/0079957 | A1 | 4/2004 | Andrews et al. |
| 2004/0080939 | A1 | 4/2004 | Braddell et al. |
| 2004/0126913 | A1 | 7/2004 | Loh |
| 2005/0077535 | A1 | 4/2005 | Li |
| 2005/0117320 | A1 | 6/2005 | Leu et al. |
| 2005/0135105 | A1 | 6/2005 | Teixeira et al. |
| 2005/0152127 | A1 | 7/2005 | Kamiya |
| 2006/0049477 | A1 | 3/2006 | Arndt |
| 2006/0220046 | A1 | 10/2006 | Yu et al. |
| 2007/0269586 | A1 | 11/2007 | Leatherdale et al. |
| 2008/0074032 | A1 | 3/2008 | Yano et al. |
| 2008/0308825 | A1 | 12/2008 | Chakraboroty et al. ........ 257/98 |
| 2009/0129073 | A1* | 5/2009 | Yaw et al. .................... 362/231 |

FOREIGN PATENT DOCUMENTS

| | | |
|---|---|---|
| JP | 06-177424 | 6/1994 |
| JP | 2001-337628 A | 12/2001 |
| JP | 2001-358369 A | 12/2001 |
| KR | 2002-0057323 A | 7/2002 |
| WO | WO 2007/083408 A1 | 7/2007 |

OTHER PUBLICATIONS

Nichia Corp. White LED Part No. NSPW312BS Specification, Jan. 14, 2004.

Kim et al. "Strongly Enhanced Phosphor Efficiency in GaInN White Light-Emitting Diodes Using Remote Phosphor Configuration and Diffuse Reflector Cup," Japanese Journal of Applied Physics, Japan Society of Applied Physics, Tokyo, JP, vol. 44, No. 20-23, Jan. 1 2005, pp. 649-651.

International Search Report and Written Opinion for counterpart PCT Application No. PCT/CN2010/001854 mailed Mar. 10, 2011.

U.S. Appl. No. 11/656,759, filed Jan. 22, 2007, "Wafer Level Phosphor Coating Method and Devices Fabricated Utilizing Method".

U.S. Appl. No. 11/899,790, filed Sep. 7, 2007, "Wafer Level Phosphor Coating Method and Devices Fabricated Utilizing Method".

U.S. Appl. No. 11/473,089, filed Jun. 21, 2006, "Close Loop Electrophoretic Deposition of Semiconductor Devices".

Notification of Transmittal of International Preliminary Report on Patentability; International Preliminary Report on Patentability for PCT Patent Application No. PCT/CN2010/001009 mailed Oct. 13, 2011.

Office Action from U.S. Appl. No. 12/498,277, dated: Feb. 17, 2012.

* cited by examiner

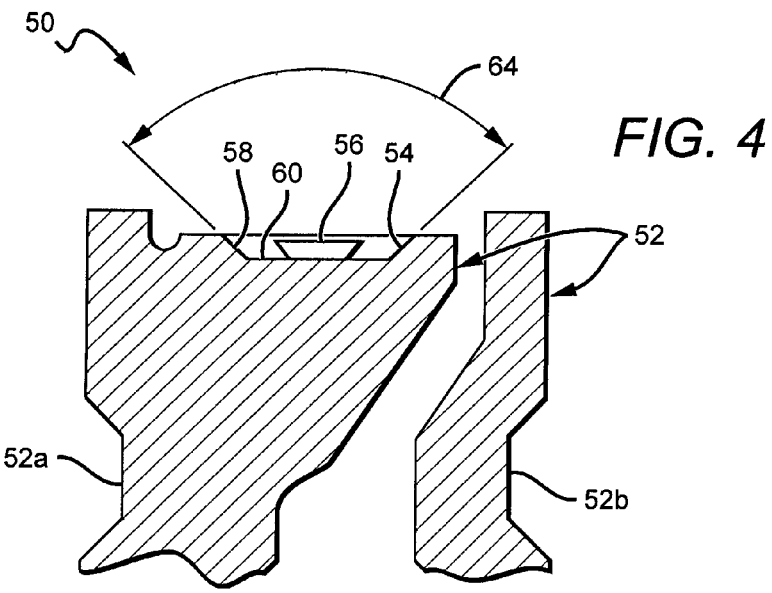
FIG. 4
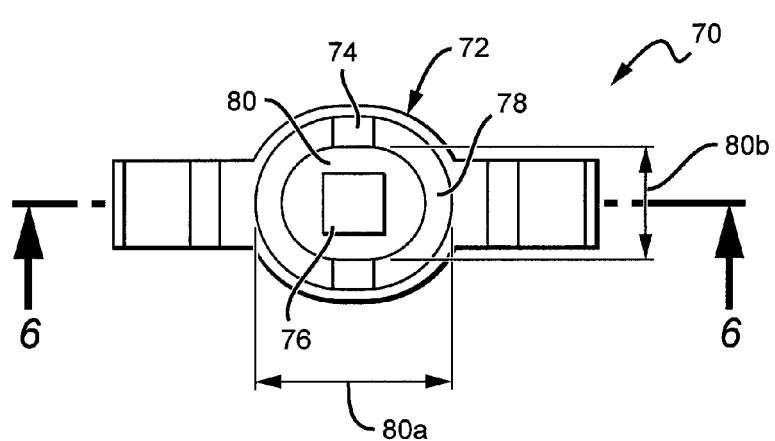
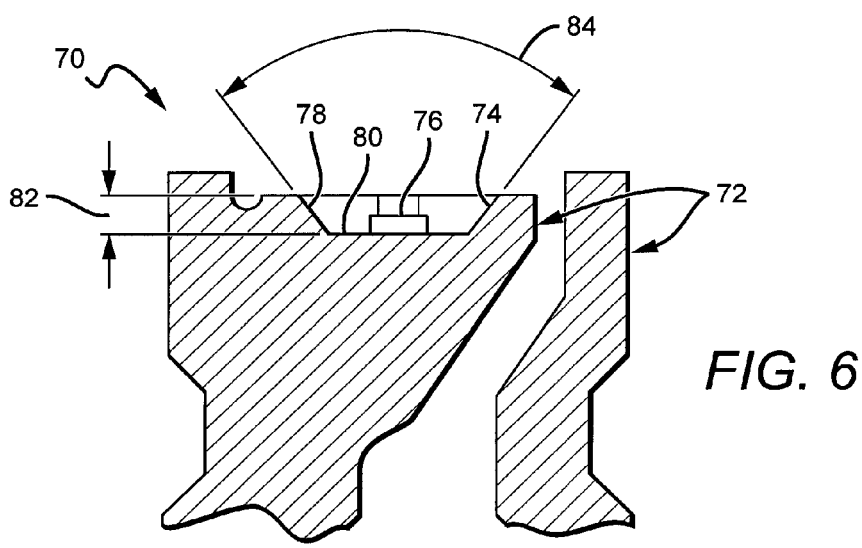
FIG. 6

T2 (10mm) > T1 (9.8mm)
ANGLE 2 > ANGLE1

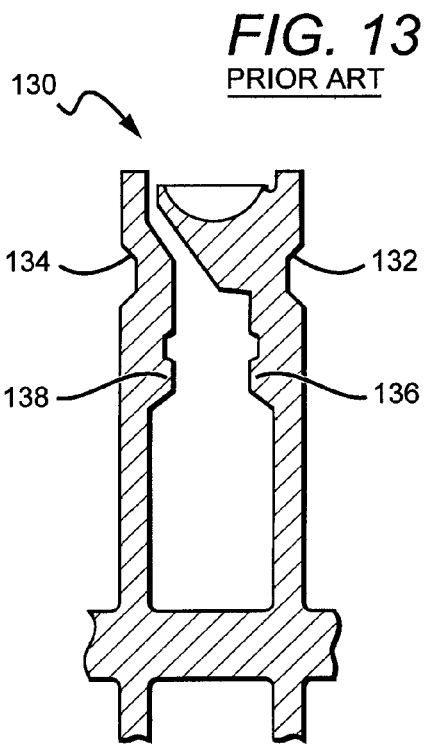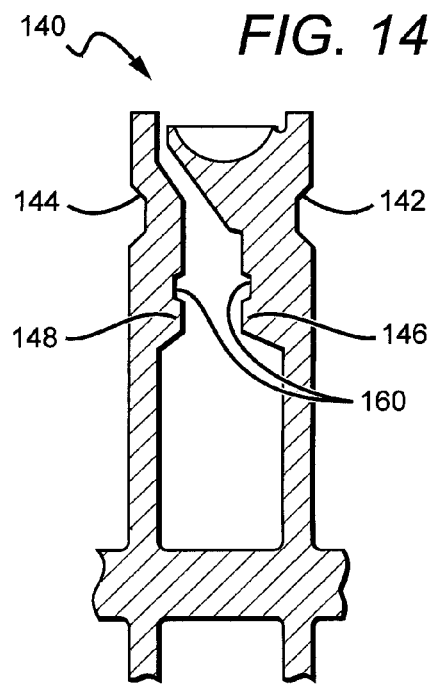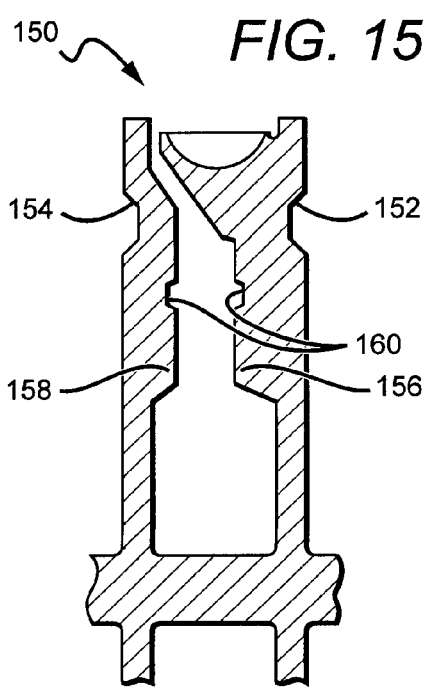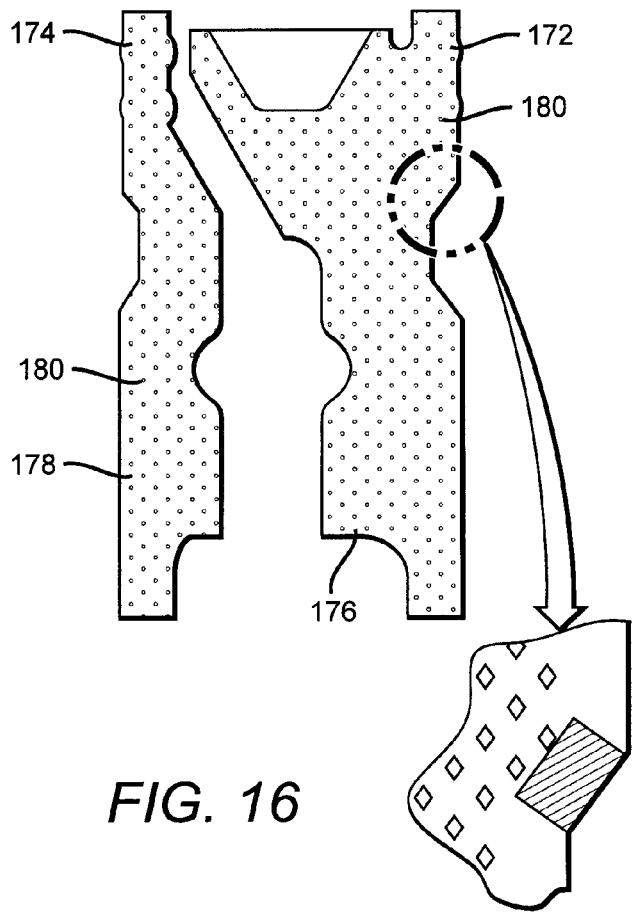

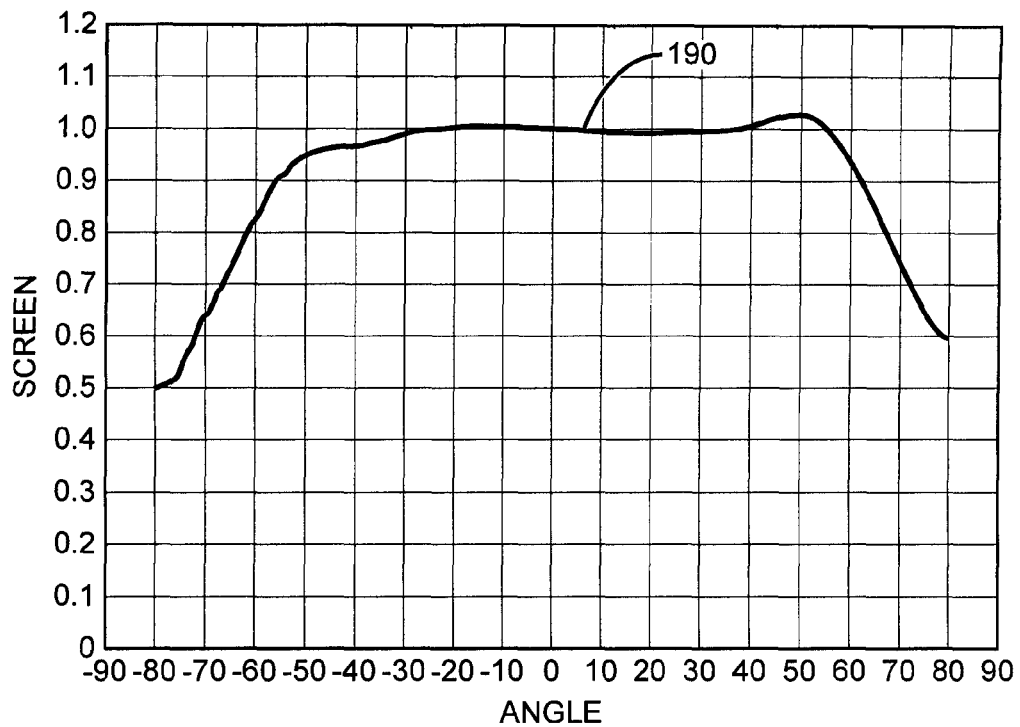
FIG. 17
FIG. 18
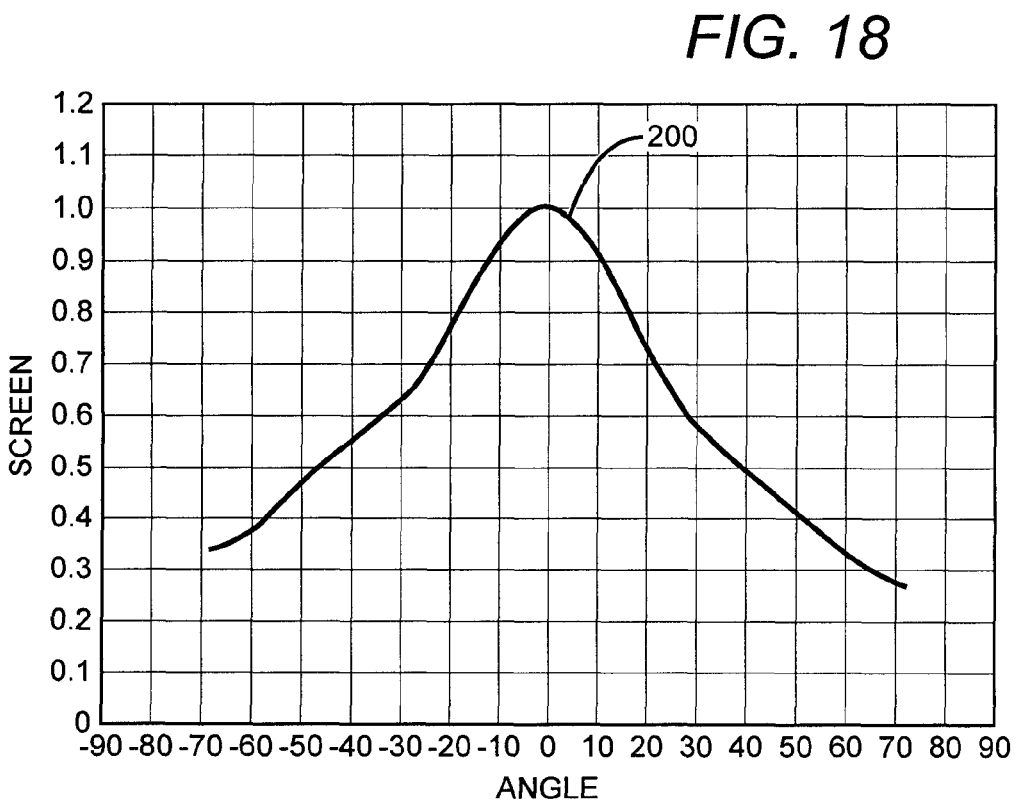

0 DEGREES

15 DEGREES

30 DEGREES

WIDE ANGLE OVAL LIGHT EMITTING DIODE PACKAGE

BACKGROUND OF THE INVENTION

1. Field of the Invention

This invention relates to light emitting diode packages and displays utilizing light emitting diode packages as their light source.

2. Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

Technological advances over the last decade or more has resulted in LEDs having a smaller footprint, increased emitting efficiency, and reduced cost. LEDs also have an increased operation lifetime compared to other emitters. For example, the operational lifetime of an LED can be over 50,000 hours, while the operational lifetime of incandescent bulb is approximately 2,000 hours. LEDs can also be more robust than other light sources and can consume less power. For these and other reasons, LEDs are becoming more popular and are now being used in more and more applications that have traditionally been the realm of incandescent, fluorescent, halogen and other emitters.

In order to use an LED chip in conventional applications it is known to enclose an LED chip in a package to provide environmental and/or mechanical protection, color selection, light focusing and the like. An LED package also includes electrical leads, contacts or traces for electrically connecting the LED package to an external circuit. In a typical LED package/component 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to, or integral with the reflective cup 13. The reflective cup 13 may be filled with an encapsulant material 16 which may contain a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens. While the reflective cup 13 may direct light in an upward direction, optical losses may occur when the light is reflected (i.e. some light may be absorbed by the reflector cup due to the less than 100% reflectivity of practical reflector surfaces). In addition, heat retention may be an issue for a package such as the package 10 shown in FIG. 1, since it may be difficult to extract heat through the leads 15A, 15B.

Different LEDs packages, such as those shown in FIG. 1, can be used as the light source for displays, both big and small. Large screen LED based displays (often referred to as giant screens) are becoming more common in many indoor and outdoor locations, such as at sporting arenas, race tracks, concerts and in large public areas such as Times Square in New York City. Some of these displays or screens can be as large as 60 feet tall and 60 feet wide. These screens can comprise thousands of "pixels" or "pixel modules", each of which can contain a plurality of LEDs. The pixel modules can use high efficiency and high brightness LEDs that allow the displays to be visible from relatively far away, even in the daytime when subject to sunlight. The pixel modules can have as few as three or four LEDs (one red, one green, and one blue) that allow the pixel to emit many different colors of light from combinations of red, green and/or blue light. In the largest jumbo screens, each pixel module can have dozens of LEDs. The pixel modules are arranged in a rectangular grid. In one type of display, the grid can be 640 modules wide and 480 modules high, with the size of the screen being dependent upon the actual size of the pixel modules.

Most conventional LED based displays are controlled by a computer system that accepts an incoming signal (e.g. TV signal) and based on the particular color needed at the pixel module to form the overall display image, the computer system determines which LED in each of the pixel modules is to emit light and how brightly. A power system can also be included that provides power to each of the pixel modules and the power to each of the LEDs can be modulated so that it emits at the desired brightness. Conductors are provided to apply the appropriate power signal to each of the LEDs in the pixel modules.

LED displays are rarely mounted at the viewer's eye level, and are more typically mounted at an elevation above eye level, such as on the side of a building or the top of the grandstands in a stadium. Referring now to FIG. 2, a conventional LED display 20 is shown mounted at an elevated point above the eye level of the viewer 22. The viewer 22 is typically positioned below the display 20 and looks up to the display such that the viewer's line of sight 24 to the display 20 is at an angle $\theta$ to the display's perpendicular emission direction 26. The LED display in FIG. 2 typically comprises a plurality of emitters 28 such as those shown in FIG. 1 that exhibit a peak emission that is typically along the packages longitudinal axis with peak emission near the center.

Having a display comprising a plurality of LED packages 28 can result in display peak emission characteristics perpendicular in the perpendicular direction 26, as shown. The Iv and far field pattern (FFP) peak emission characteristics for the LED display 20 can be perpendicular to the display along the perpendicular axis 26. The viewer's line of sight 24 is below perpendicular when the display 20 is mounted at an elevated point, much of the light emitted by the display is not seen by the viewer and is wasted. This can be true for viewers below the display and the side of the display. One way to reduce the amount of light that is wasted is by mounting the display at an angle to better match the viewer's line of sight 24, but this can require complex and expensive mounting hardware that is difficult to use, particularly for very large displays mounted at high elevations.

Viewers are often not directly in front of an LED based displays when it is viewed. Depending on where the viewer is located the horizontal viewing angle can be different. Furthermore, when a person is moving by an LED display, such as walking by, it is viewed at many different horizontal angles. Typical LED displays with peak emissions near the center can experience a drop-off in emission intensity at different horizontal angles. The far field pattern (FFP) for the different LED packages in each of the pixels can also be different such that the LED display can experience image quality variations when viewed from different angles.

SUMMARY OF THE INVENTION

The present invention is directed to LED packages and LED displays utilizing the LED packages, wherein the LED packages are arranged to provide wide angles of horizontal emission. This results in LED displays exhibiting improved emission characteristics such as wide angle far field patterns.

The LED displays can also exhibit improved picture quality through ranges of vertical viewing angles. The LED packages can also comprise features that provide for more reliable operation.

One embodiment of an LED display according to the present invention comprises a plurality of LED packages each of which has a horizontal emission angle and a vertical emission angle. The horizontal emission angle is greater than the vertical emission angle in at least some of said LED packages used in the display.

One embodiment of an LED package according to the present invention comprises a lead frame at least partially embedded in an encapsulant, wherein the lead frame comprises a reflective cup with an LED. The reflective cup and encapsulant are arranged to cause emission of LED light from the LED package with an emission angle in a first direction that is greater than the emission in a second direction.

Another embodiment of an LED display according to the present invention comprises a plurality of LED packages each of which has a horizontal emission angle and a vertical emission angle. The horizontal emission angle is greater than the vertical emission angle in at least some of said LED packages such that the LED display produces a horizontal far field pattern wider than its vertical far field pattern.

Another embodiment of an LED display according to the present invention comprises a plurality of pixels, each of which comprises a plurality of LED packages emitting different colors of light. Each of the LED packages has a horizontal emission angle and a vertical emission angle wherein the horizontal emission angle is greater than the vertical emission angle. The emission pattern of each of the LED packages at different vertical viewing angles within a range of viewing angles is substantially the same.

These and other aspects and advantages of the invention will become apparent from the following detailed description and the accompanying drawings which illustrate by way of example the features of the invention.

BRIEF DESCRIPTION OF THE DRAWINGS

FIG. 4 is a side view of the lead frame shown in FIG. 3;

FIG. 5 is the top view of another embodiment of a lead frame according to the present invention;

FIG. 6 is a side view of the lead frame shown in FIG. 5;

FIG. 13 shows a conventional lead frame;

FIG. 14 shows one embodiment of a lead frame according to the present invention;

FIG. 15 shows another embodiment of a lead frame according to the present invention;

FIG. 16 shows still another embodiment of a lead frame according to the present invention;

FIG. 17 is a graph showing the horizontal emission pattern for one embodiment of an LED display according to the present invention;

FIG. 18 is a graph showing the vertical emission pattern for an LED display according to the present invention;

DETAILED DESCRIPTION OF THE INVENTION

Figure 1:
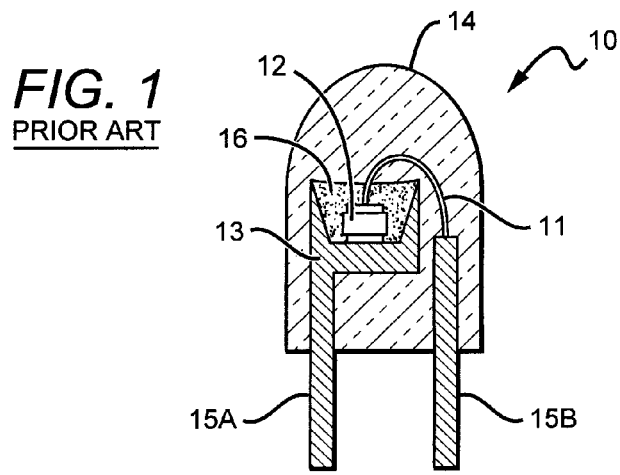
FIG. 1 is a conventional light emitting diode package.
Figure 2:
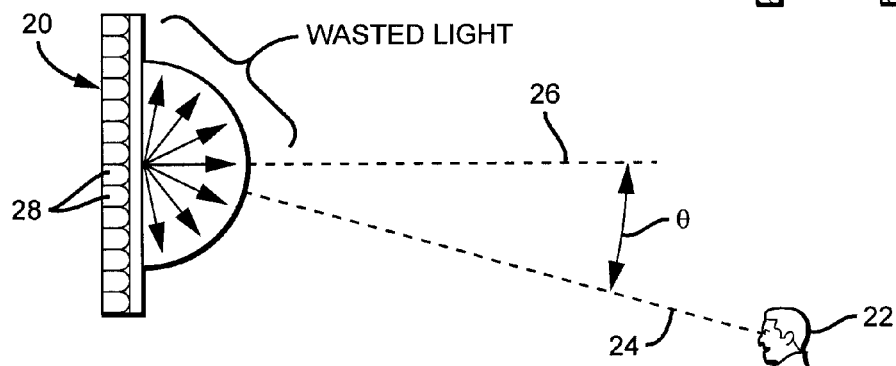
FIG. 2 is a schematic showing a typical viewing angle for some LED displays.

The present invention is directed to LED packages and LED displays utilizing LED packages where the peak emission of the LED displays can exhibit improved emission characteristics. In some embodiments the improved characteristics include a wider horizontal emission angle for the LED packages according to the present invention, which results in improved emission characteristics for the LED display such as a wider far field pattern. This provides improved picture intensity and quality when viewing the display at different horizontal viewing angles. Different embodiments also provide for improved emission characteristics for LED packages emitting different colors of light when viewing at different vertical angles. In one embodiment the red and green LED packages can have emission patterns that are substantially the same at different vertical viewing angles within a range. This helps the colors of the display appear consistent at those angles.

These improved emission characteristics can be achieved in LED displays having LED packages with unique dimensions and arrangements. These can include but are not limited to the optical design of the reflective cup, the height of the lead-frame in the package encapsulant, and the shape dimension and shape of the LED package encapsulant. The LED packages according to the present invention can also have features that make the packages more reliable through different operational temperatures. These can include lead-frame dimensions that provide for improved thermal dissipation of the heat generated by the LED. The lead-frame can also be provided with a surface roughness that provides for improved adhesion between the lead frame and the encapsulant.

The combination of the above features provide for an LED display with more reliable operation and improved emission characteristics for LED displays viewed at different horizontal and vertical angles.

Many different embodiments according to the present invention are described below that provide for the desired emission characteristics, but it is understood that the characteristics can be provided in different ways beyond those described herein. Some of the LED package embodiments below are described with reference wider horizontal emission angles, but it is understood that the present invention can also be used to provide for LED packages that can also be arranged to provide for larger vertical emission angles. It is also understood that the different viewing angles described below are only representative of the different angles that can be provided in different embodiments. Although the embodiments of the displays are described with reference to LED packages, it is also understood that many different types of emitters can be used, and the use of this term is meant to encompass all solid state emitters such as LEDs, LED chips and laser diodes. The LED packages are described herein having a single LED, but it is understood that they can have more than one LED. The LED packages according to the present invention can also have different mounting arrangements for mounting in the display, such a leads or surface mount arrangements.

The present invention is described herein with reference to certain embodiments, but it is understood that the invention can be embodied in many different forms and should not be construed as limited to the embodiments set forth herein. In particular many different LED, reflective cup and lead frame arrangements can be provided beyond those described above, and the encapsulant can provide further features to improve the reliability and emission characteristics from the LED packages and LED displays utilizing the LED packages. Although the different embodiments of LED packages discussed below are directed to use in LED displays, they can be used in many other applications either individually or with other LED packages having the same or different peak emission tilt.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

As described above, the improved emission characteristics of the LED displays according to the present invention can at least partially be achieved by utilizing LED packages with unique reflector cup designs. In some embodiments the reflective cup can have an oval shape with different angles and heights to its side surfaces to match the structure and emission characteristics of the LED chip mounted in the reflective cup. For example, reflective cups can have different angles and dimensions for LEDs that emit light out of all surfaces (i.e. body emission LEDs) compared to reflective cups for LEDs that emit primarily out the top surface (i.e. top emission LEDs).

Figure 3:
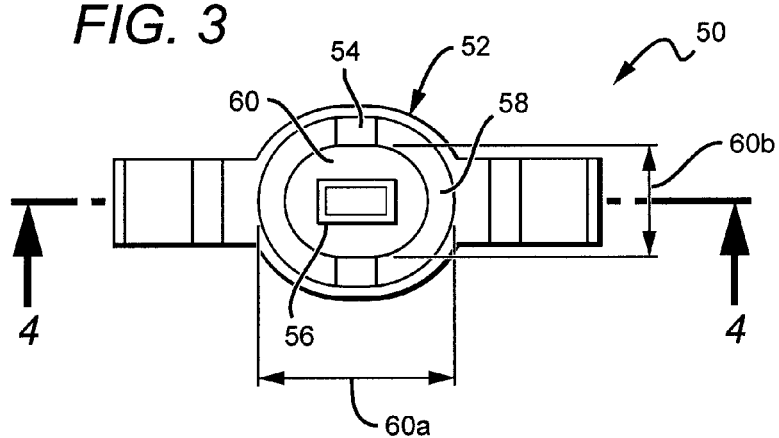
FIG. 3 is a top view of one embodiment of a lead frame according to the present invention.

FIGS. 3 and 4 show one embodiment of LED package 50 according to the present invention that is typically embedded in an encapsulant, such as epoxy. The LED package and some embodiments below are shown without the encapsulant for ease of description. The package 50 comprises a lead frame 52 having a reflective cup 54, with an LED 56 mounted at the base of the reflective cup 54. The lead frame 52 can be made of conventional materials using known manufacturing methods. An electrical signal can be applied to the LED 56 through the first lead section 52a and second lead frame section 52b, with a wire bond (not shown) passing between the second lead frame section 52b and the LED 56 to carry the electric signal to the LED 56.

Many different types of LEDs can be used in the package 50. Fabrication of conventional LEDs is generally known, and is only briefly discussed herein. LEDS can be fabricated using known processes with a suitable process being fabrication using metal organic chemical vapor deposition (MOCVD). The layers of the LEDs generally comprise an active layer/region sandwiched between first and second oppositely doped epitaxial layers all of which are formed successively on a growth substrate. LEDs can be formed on a wafer and then singulated for mounting in a package. It is understood that the growth substrate can remain as part of the final singulated LED or the growth substrate can be fully or partially removed.

It is also understood that additional layers and elements can also be included in LEDs 56, including but not limited to buffer, nucleation, contact and current spreading layers as well as light extraction layers and elements. The active region can comprise single quantum well (SQW), multiple quantum well (MQW), double heterostructure or super lattice structures. The active region and doped layers may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP).

The growth substrate can be made of many materials such as sapphire, silicon carbide, aluminum nitride (AlN), gallium nitride (GaN), with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022.

LEDs can also comprise a conductive current spreading structure and wire bond pads on the top surface, both of which are made of a conductive material that can be deposited using known methods. Some materials that can be used for these elements include Au, Cu, Ni, In, Al, Ag or combinations thereof and conducting oxides and transparent conducting oxides. The current spreading structure can comprise conductive fingers arranged in a grid on LEDs 56 with the fingers spaced to enhance current spreading from the pads into the LED's top surface. In operation, an electrical signal is applied to the pads through a wire bond as described below, and the electrical signal spreads through the fingers of the current spreading structure and the top surface into the LEDs. Current spreading structures are often used in LEDs where the top surface is p-type, but can also be used for n-type materials.

Some or all of the LEDs described herein can be coated with one or more phosphors with the phosphors absorbing at least some of the LED light and emitting a different wavelength of light such that the LED emits a combination of light from the LED and the phosphor. In one embodiment according to the present invention the white emitting LEDs have an LED that emits light in the blue wavelength spectrum and the phosphor absorbs some of the blue light and re-emits yellow. The LEDs emit a white light combination of blue and yellow light. In other embodiments, the LED chips emit a non-white light combination of blue and yellow light as described in U.S. Pat. No. 7,213,940. In some embodiments the phosphor comprises commercially available YAG:Ce, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for white emitting LED chips include: $Tb_{3-x}RE_xO_{12}$:Ce(TAG); RE=Y, Gd, La, Lu; or $Sr_{2-x-y}Ba_xCa_ySiO_4$:Eu.

LEDs that emit red light can comprise LED structures and materials that permit emission of red light directly from the active region, such as in reddish AlInGaP LEDs. Alternatively, in other embodiments the red emitting LEDs can comprise LEDs covered by a phosphor that absorbs the LED light and emits a red light. The LEDs can emit blue or UV light and some phosphors appropriate for these structures can comprise: $Lu_2O_3$:$Eu^{3+}$; $(Sr_{2-x}La_x)(Ce_{1-x}Eu_x)O_4$; $Sr_{2-x}Eu_xCeO_4$; $SrTiO_3$:$Pr^{3+}$,$Ga^{3+}$; $CaAlSiN_3$:$Eu^{2+}$; and $Sr_2Si_5N_8$:$Eu^{2+}$.

LEDs that are coated can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. Alternatively the LEDs can be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference. It is understood that LED packages according to the present invention can also have multiple LEDs of different colors, one or more of which may be white emitting.

According to one aspect of the present invention, the reflective cup 54 can have different dimensions to match the emission characteristics of its particular LED. In the embodiment shown, the reflective cup 54 has dimensions best suited for body emitting LEDs. Body emitting LEDs refers to LEDs where light from the active region emits out of all surfaces of the LED. Different LEDs emitting different colors of light can be body emitting, such as conventional blue or green LEDs, some of which can be covered by a phosphor as described above. The side reflective surface 58 of the reflective cup 54 can be arranged to have the height and angle suitable for a body emitting LED.

In the embodiment shown, the reflective cup 54 is oval shaped such to promote LED package emission with a wider emission angle. The reflective cup 54 when viewed from above longer in a first direction compared to the a second orthogonal direction. The reflective cup 54 has also has a bottom surface 60 that is longer in a first direction 60*a* compared to a second orthogonal direction 60*b*. In one embodiment the first direction 60*a* is approximately 10% or more in length than the second orthogonal direction 60*b*. In other embodiments the first direction 60*a* is approximately 20% or more in length than the second orthogonal direction 60*b*. In still other embodiments, the first direction 60*a* can be 30% or more than the orthogonal direction 60*b*. In one embodiment, the first direction is approximately 0.9 mm and the orthogonal direction is approximately 0.65 mm.

It is understood that the size of the reflective cup can also be dependent upon other factors. Different sized lenses or encapsulants can limit the size of a particular reflective cup. If a reflective cup is too large for a particular encapsulant it can be too close to the encapsulant surface, which can present a danger of cracking. Different sized LEDs can also impact the size of the reflective cup. If the reflective cup is too small compared to the size of the LED, then it difficulties can be experienced when mounting the LED in the reflective cup.

The reflective cup 54 for the embodiment shown can be arranged to reflect most of the light from its body emitting LED 56 so that the light from the LED contributes to the useful emission of the display. In the embodiment shown, side reflective surface 58 can be higher than the top surface of the LED 56. In one embodiment, the height of the side surface above the top surface of the LED 56 can be 50% or more of the overall height of the LED 56. In other embodiments, the height of the side surface 58 above the top surface of the LED 56 can be 30% or more of the overall height of the LED 56. In still other embodiments, the height of the side surface above the top surface of the LED 56 can be 10% or more of the overall height of the LED 56. In one embodiment the LED chip can have a height 62 of greater than approximately 0.05 mm, and in another embodiment greater than approximately 0.10 mm. In one embodiment the reflective surface can have a height of approximately 0.15 mm, with an LED having a height of approximately 0.10 mm.

The reflective cup can also have a reflective opening 64 measured as an angle between opposing reflective surfaces. In some embodiments the reflective opening can be approximately 80° or more, while in other embodiments it can be approximately 90° or more. In the embodiment shown, the reflective opening 64 can have an angle of approximately 100°, although it is understood that the reflective cup can have different sizes and angles.

FIGS. 5 and 6 show another embodiment of LED package according to the present invention that has a similar oval shape as in the LED package 50, and comprises a similar lead frame 72 and reflective cup 74, with an LED 76 mounted to the bottom surface 80 of the reflective cup 74. In this embodiment the LED 76 is top emitting, meaning that most emission from the LED 76 is out its top surface. Like the embodiment above, the bottom surface 80 is oval shaped and is longer in one direction 80*a* compared to its orthogonal direction 80*b*. In one embodiment the differences in these lengths can be 10, 20 or 30% or more as described above, and in one embodiment can be approximately 0.9 mm by 0.65 mm.

The side reflective surface 78 of reflective cup 74, however, can have dimensions more suitable for the emission characteristics of a top emitting LED. The side reflective surface 78 can have a greater height compared to the height of the LED 76 than the reflective cups for body emitting LEDs to reflect more of the light emitting from the LED's top surface. In one embodiment, the height of the side surface 78 above the top surface of the LED 76 can be 150% or more of the overall height of the LED 76. In other embodiments, the height of the side surface 78 above the top surface of the LED 76 can be 100% or more of the overall height of the LED 76. In still other embodiments, the height of the side surface 78 above the top surface of the LED 76 can be 50% or more of the overall height of the LED 76. In the embodiment shown, the height 82 of the side reflective surface 78 can be approximately 0.25 mm for an LED 76 having a height of approximately 0.10 mm.

Like the embodiment above, the reflective cup 74 can have a reflective opening 84 measured as an angle between opposing reflective surfaces. The reflective opening can be different for the top emitting LED to capture and redirect more light from the LED in the desired direction. In some embodiments the reflective opening 84 can be approximately 60° or more, while in other embodiments it can be approximately 70° or more. In the embodiment shown, the reflective opening 84 can have an angle of approximately 80°, although it is understood that the reflective cup can have different sizes and angles.

It is understood that the reflective cups according to the present invention can have many different dimensions depending on the size and emission characteristics of its LED. This matching of the reflective cup dimensions, such as the reflective surface height and reflective opening, to match the particular LED can allow for increasing and matching the width of viewing angle of overall display and matching of FFP for different LED types.

Shape and dimensions of the reflective cups according to the present invention help promote LED package emission at larger viewing angles and also promote similar emission characteristics for LED packages having different LED types. That is, having different reflector cup arrangements for different LED types, similar amounts of light can be reflected in substantially matching emission patterns.

Figure 7:
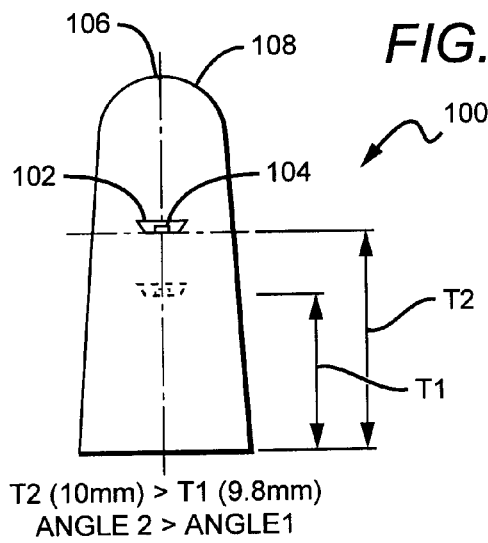
FIG. 7 is a side view of one embodiment of a reflective cup and encapsulant according to the present invention.

The LED packages according to the present invention can also have other characteristics and dimensions that help promote emission at wider viewing angles. FIG. 7 shows one embodiment of an LED package 100 according to the present invention comprising a reflective cup 102 and LED 104, all of which are embedded in an encapsulant 108. The LED package can also comprise a lead frame that is omitted in this figure for ease of description. In conventional LED packages the reflective cup is typically located in the encapsulant at a height T1 so that the package provides focused light with relatively small emission angles. By contrast, the reflective cup 102 in the LED package 100 is arranged at a higher point T2 in the encapsulant so that it is closer to the encapsulant top 106. In some embodiments, the reflective cup 102 can be up to 40% higher than prior packages, while in other embodiments it can be up to 20% higher than prior packages. In still other embodiments it can be up to 10% more than prior packages.

In some embodiments, the reflective cup 102 can have distance from the encapsulant top 106 that is 25% or less than the overall height of the encapsulant 108. In other embodiments, the reflective cup 102 can have distance from the encapsulant top 106 that is 35% or less than the overall height of the encapsulant 108. In still other embodiments, the reflective cup 102 can have distance from the encapsulant top 106 that is 45% or less than the overall height of the encapsulant 108. In the embodiment shown, the encapsulant 108 has a height of approximately 6.3 mm and the reflective cup 108 is mounted within the encapsulant 108 at a location that is approximately 2.2 mm from the encapsulant top 106. This results in the angle of emission for LED package 100 being greater based on the closer proximity of the reflective cup 102 to the encapsulant top 108.

Figure 8:
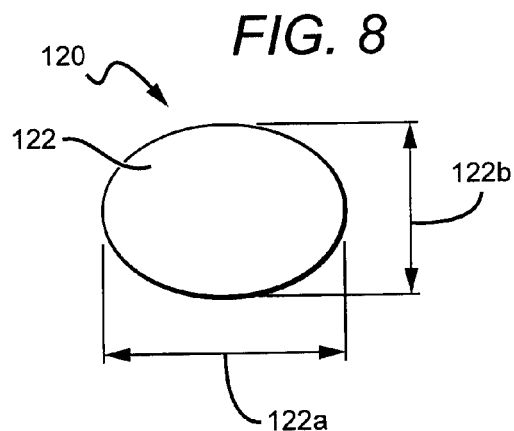
FIG. 8 is a top view of one embodiment of an encapsulant according to the present invention.
Figure 9:
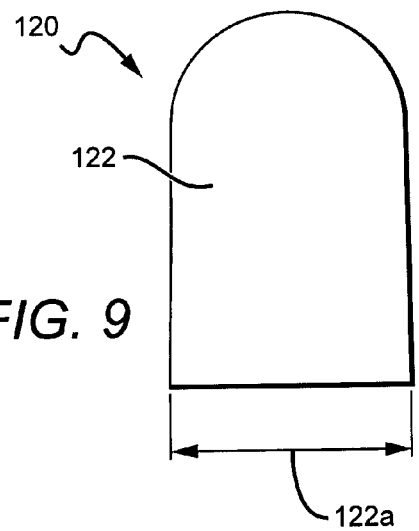
FIG. 9 is a side view of the encapsulant shown in FIG. 8.
Figure 10:
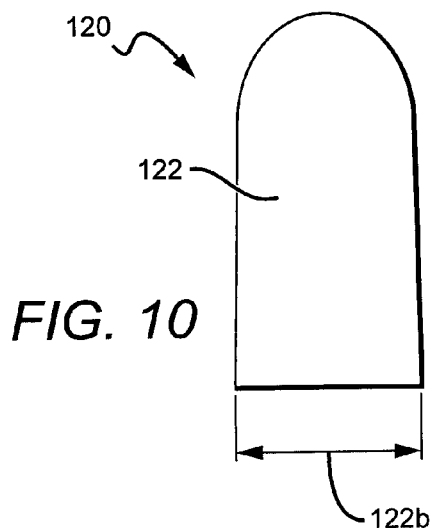
FIG. 10 is another side view of the encapsulant shown in FIG. 8.

Different embodiments according to the present invention can have other structural changes that can increase the horizontal angle of emission, such as the shape of the encapsulant. FIGS. 8, 9 and 10 show another embodiment of an LED package 120 showing only its encapsulant 122. The encapsulant has a cross-section with oval dimensions to promote wide angle emission. The encapsulant 122 has a greater length in a first direction 122a compared to the second direction 122b that is normal to the first direction 122a. In some embodiments the first direction 122a can be 40% or more larger than the second direction 122b. In other embodiments it can be 30% or more larger, while in other embodiments it can be 20% or more larger. In one embodiment, the first direction 122a can measure 3.9 mm and the second direction 122b can measure 3.0 mm high at one point the body of the encapsulant.

In some embodiments the encapsulant can be used with conventional circular reflective cups, with the overall package experiencing wider emission angle based on the oval shape of the encapsulant. In other embodiments, the encapsulant can be used with oval shaped reflector cups aligned with the oval shape of the encapsulant to provide even wider emission. In still other embodiments, the reflective cup can have different reflective surface heights and angles to match the emission of its LED, which can further widen the emission angles of the packages. In still other embodiments, the reflective cup can be arranged higher in the encapsulant to further widen the emission angles. It is understood that the LED packages according to the present inventions can have different combinations of these features to produce the desired emission width.

Figure 11:
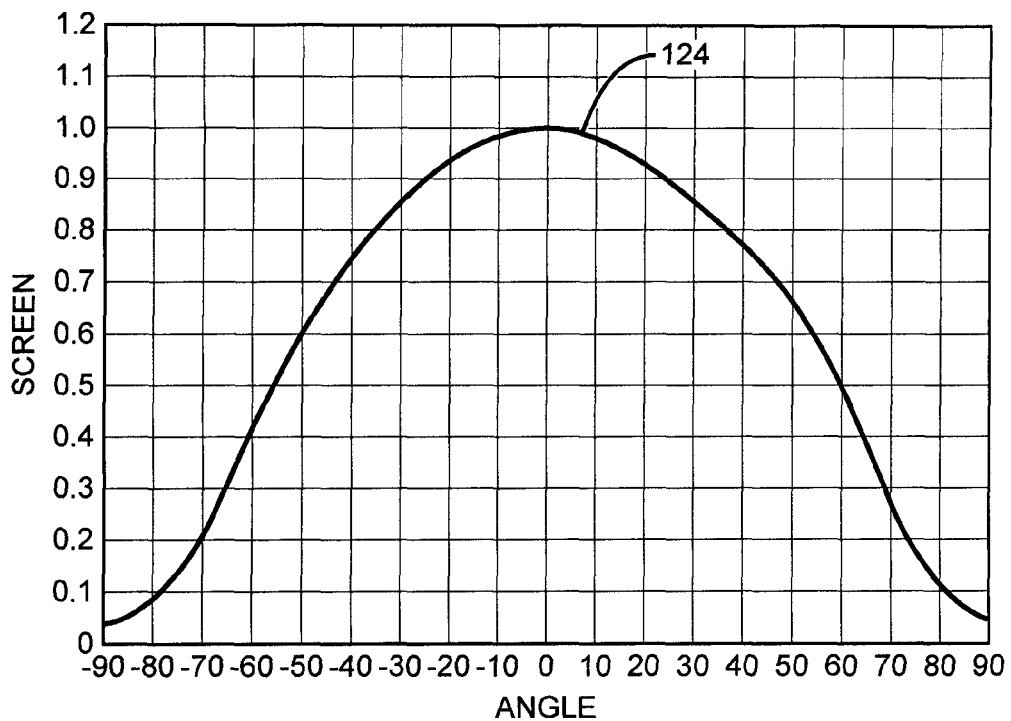
FIG. 11 is a graph showing the horizontal emission pattern for one embodiment of an LED package according to the present invention.
Figure 12:
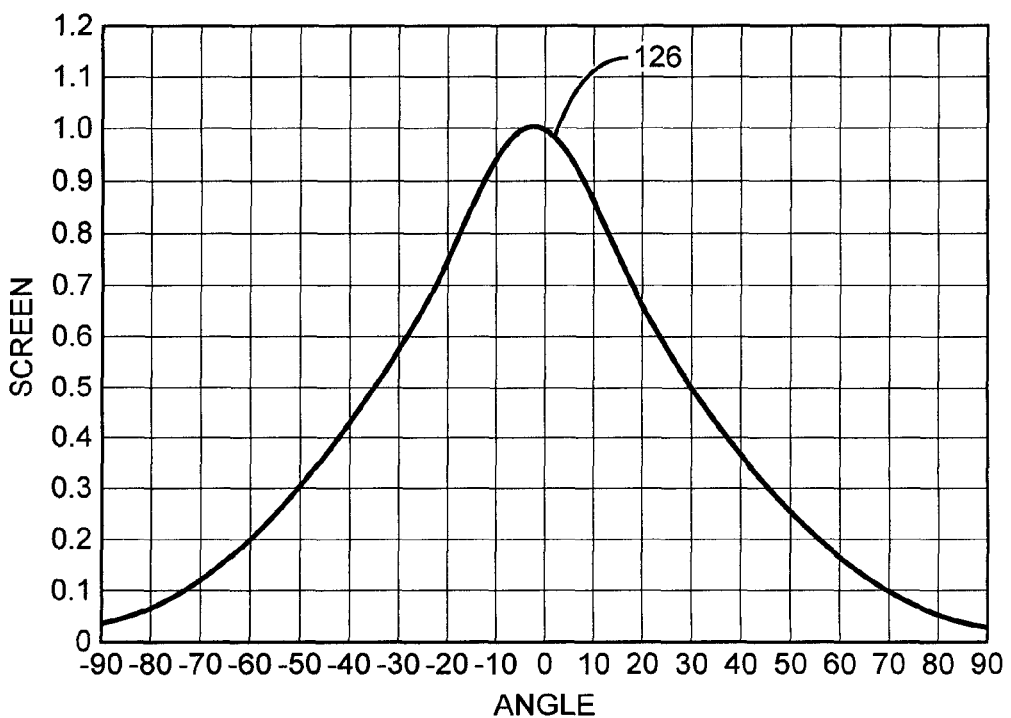
FIG. 12 is a graph showing the vertical emission pattern of an LED package according to the present invention.

The LED packages according to the present invention can produce emission with different width of emissions. In some embodiments the angle of emission can be greater than 90° and up to 120°, while in other embodiments it can be up to 140°. FIG. 11 shows one embodiment of the horizontal far field pattern (FFP) 124 for the emission of one embodiment of an LED package according to the invention with features to increase the horizontal emission width. The features of the LED package produce a wide angle of horizontal emission of approximately 115°. FIG. 12 shows the vertical emission FFP 126 for an LED package according to the present invention without features to increase the width of vertical emission. The vertical emission has a FFP width of approximately 65°.

LED packages according to the present invention can also be arranged with features that allow for reliable operation and elevated current and heat level. In high current and high luminous flux applications the LED mounted in the reflective cup can generate heat that can spread to the encapsulant surrounding the LED or into the lead frame. The ability for the LED package to operate at higher current levels depends at least partially on the package's ability to dissipate heat from the LED and the ability of the lead frame to adhere to the encapsulant through temperature cycles.

Referring now to FIGS. 13, 14 and 15, a conventional LED package lead frame is shown in comparison to two embodiments of lead frames according to the present invention. FIG. 13 shows a conventional lead frame 130 with the reflector cup portion 132 and wire bond portion 134 where a wire bond is included to the LED in the reflector cup. The reflective cup portion 132 includes an enlarged reflective cup heat spreader 136 below it, and the wire bond portion 134 includes an enlarged wire bond heat spreader 138 below it. Both the reflective cup and wire bond heat spreaders 136, 138 are arranged to provide increased surface area so that heat generated from the LED during operation spreads from the LED so that the heat can more readily dissipates into the surrounding encapsulant.

FIG. 14 also shows one embodiment of a lead frame 140 according to the present invention having a reflective cup portion 142, a wire bond portion 144, a reflective cup heat spreader 146, and a wire bond heat spreader 148. In this embodiment, however, the reflective cup heat spreader 146 is enlarged to provide reduced thermal resistance and increased surface area to more efficiently spread and dissipate heat from the LED. In the embodiment shown the reflective cup heat spreader 146 is wider than those in conventional lead frames, with some convention lead frames having a width of approximately 0.9 mm. In some embodiments the reflective cup heat spreader 146 can have a width that is 40% or more than in conventional lead frames. In other embodiments the reflective cup heat spreader can have a width that is 30% or more than the reflective cup heat spreader 146 in conventional lead frames. In still other embodiments the reflective cup heat spreader 146 can have a width that is 20% or more than the reflective cup heat spreader in conventional lead frames. In the embodiment shown, the reflective cup heat spreader can have a width of approximately 1.25 mm. This increase in width can result in a reduction in thermal resistance of approximately 12.5% compared to conventional lead frames (168 to 147 K/W). It is understood that other embodiments can have different sizes of reflective cup heat spreaders, and in still others the wire bond heat spreader 148 can also be wider to improve heat spreading.

FIG. 15 shows another embodiment of an LED lead frame 150 according to the present invention also having a reflective cup portion 152, wire bond portion 154, reflective cup heat spreader 156, and a wire bond heat spreader 158. In this embodiment, however, the reflective cup heat spreader 156 is not only wider than in conventional lead frames, but also longer. This provides further decrease in thermal resistance with an increase in surface area to more efficiently dissipate heat. In one embodiment, the length of the reflective cup dissipater is increased by length of 10% or more, while in other embodiments the length can be increased 20% or more. In still other embodiments the length can be increased by 30% or more. In the embodiment shown, the bottom of the reflective cup heat spreader is increased by 0.5 mm and measures 3.75 mm from the top of the reflective cup portion 152. This approximately 15% increase in length can result in a reduction in thermal resistance of approximately 38% (186 to 115 K/W). In some embodiments only the reflective cup heat spreader is increased in length in the lead frame 150. However, the length of the wire bond heat spreader 158 can also be increased at the same or different length than the reflective cup dissipater 156. This similarly decreases the thermal resistance of the wire bond dissipater to more efficiently spread and dissipate heat. It is understood that although the invention is described in regard to increasing the width and length of the dissipaters, other dimensions can also be increased, such as the thickness.

Each of the lead frames can also include features that improve adhesion to the encapsulant, which also improves reliability. Each of the embodiments shown in FIGS. 14 and 15 can include cut-outs 160 that are arranged to hold the lead frame to the encapsulant in a finished LED package. Other adhesion features can also be included. FIG. 16 shows another embodiment of a lead frame 170 according to the present invention also comprising a reflective cup portion 172, wire bond portion 174, reflective cup heat spreader 176, and wire bond heat spreader 178. In this embodiment, different features of the lead frame 170 can include surface roughening or stamped features 180 covering all or some of its surfaces. The features 180 can be formed using many known processes such as metal stamping. The features 180 provide for increased adhesion between the encapsulant and the lead frame 170 through temperature cycles by the encapsulant filling the feature during manufacturing.

The features 180 can have many different sizes and can all be the same size or can have different sizes. They can be randomly located on the lead frame or and can be in a pattern. The features 180 are provided in a pattern of similarly shaped features that can be included in many different locations and in the embodiment shown are located primarily on the reflective cup heat spreader 176 and wire bond heat spreader 178. One embodiment of the features 180 can have a general pyramid shape with a base of approximately 0.05 by 0.05 mm, and a depth of approximately 0.03 mm. There can also be a space of approximately 0.10 mm between adjacent features. It is understood that the stamped features and enlarged dissipaters can be used alone or in combination to provide for more reliable LED package operation.

The LED packages according to the present invention can be used to form an LED display with the LED display having an improved far field pattern. FIG. 17 shows a screen curve 190 for the horizontal far field pattern for one embodiment of an LED display utilizing LED packages according to the present invention. The screen exhibits substantially flat emission intensity characteristics through a range of 120 degrees of horizontal viewing angles. This provides improved viewing of the LED display at a greater range of angles, with the LED image having substantially the same intensity at the normal 0° viewing degree as at any viewing angle up to 60° on either side of normal. Accordingly, the image retains its quality at a larger range of angles compared to conventional LED based displays.

FIG. 18 shows a screen curve 200 for the vertical far field pattern for one embodiment of an LED display utilizing LED packages according to the present invention. The vertical pattern follows more of a Lambertian pattern that the LED packages described above and used in the display not having increased vertical emission angles. It is understood that in other embodiments, some or all of the LED packages can be arranged to have higher vertical viewing angles, with the vertical screen curve exhibiting a flat portion similar to that shown in FIG. 17.

Figure 19:
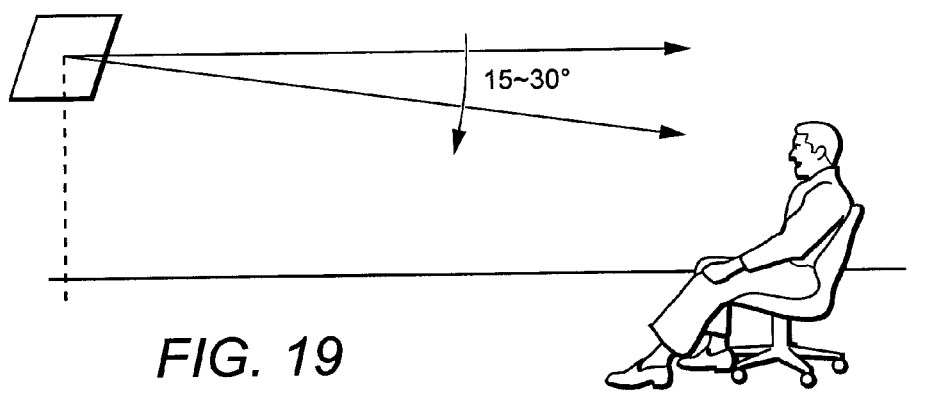
FIG. 19 shows a range of viewing angles for LED displays.
Figure 20:
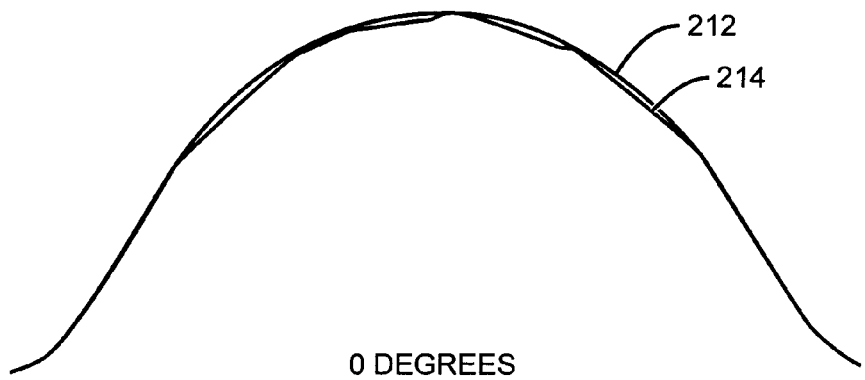
FIG. 20 is a graph showing the emission patterns for red and green LED packages according to the present invention at 0°.
Figure 21:
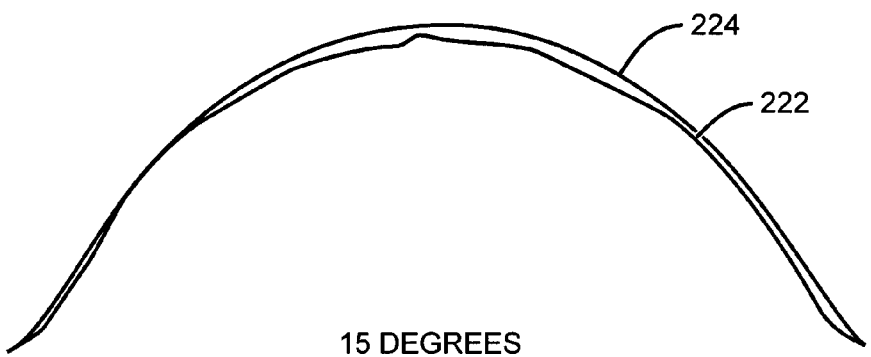
FIG. 21 is a graph showing the emission patterns for red and green LED packages according to the present invention at 15°.
Figure 22:
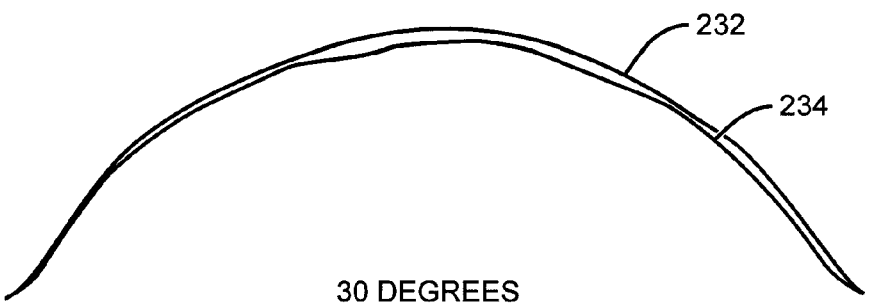
FIG. 22 is a graph showing the emission patterns for red and green LED packages according to the present invention at 30°.

The LED displays according to the present invention utilizing the LED packages according to the present invention having all or some of the features described above can also exhibit improved emission intensity curve matching within a range of vertical viewing angles. As shown in FIG. 19 the observer of an LED display can view the display from a vertical angle, such as from a certain angle below the display. In the embodiment shown the vertical viewing angle can be in the range of 0 to 30 degrees. To provide for more consistent image quality at these different viewing angles, the LED display according to the present invention provides for matching screen curves and far field patterns for its red, green and blue LEDs at these angles. FIG. 20 shows the horizontal emission patterns for red and green LED packages 212, 214 having at least some of the features described above, when viewed at 0° or perpendicular to the LED display. Blue LED packages can have emission patterns similar to the green LED packages and the patterns for each substantially matches the others. FIG. 21 shows the emission patterns 222, 224 for the same red and green LED packages according to the present invention at a 15° vertical viewing angle. Although the amplitude for each may be someone lower compared the pattern at 0°, the patterns still substantially match. FIG. 22 shows the emission patterns 232, 234 for the same LED packages at 30° with further emission amplitude reduction but still substantially matching emission curves.

The curves in FIGS. 20 through 22 illustrate that the LED displays using LED packages according to the present invention can exhibit substantially matching emission characteristics and different vertical viewing angles. Although the intensity of the light may be lower as the viewing angles increase, color quality of the picture is maintained by the emitters having the same emission curves.

The displays according to the present invention can also comprise different combinations of LED packages. That is, the LED packages in the different displays do not need to all have the same features to increase emission angles. It is understood that although the present invention has been described with reference to increasing the horizontal emission angles of LED packages, the present invention can be similarly utilized to increase the vertical emission angle. Similarly, LED displays can be used with a combination of LED packages with features that increase both the horizontal and vertical emission angles.

The LED packages according to the present invention can be used in many different lighting applications beyond LED displays, and in particular those using small sized high output light sources requiring increased emission angles. Some of these include, but are not limited to, street lights, architectural lights, home and office lighting, display lighting and backlighting.

Although the present invention has been described in detail with reference to certain preferred configurations thereof, other versions are possible. Therefore, the spirit and scope of the invention should not be limited to the versions described above.

We claim:

1. A light emitting diode (LED) display, comprising:
a plurality of LED packages each of which has a horizontal emission angle and a vertical emission angle, wherein said horizontal emission angle is greater than said vertical emission angle in at least some of said LED packages;
wherein each of said at least some of said LED packages comprises a reflective cup with an LED, said reflective cup comprising an opening that is larger for body emitting LEDs compared to reflective cups with similarly sized top emitting LEDs.

2. The LED display of claim 1, wherein each of said at least some LED packages comprises an oval shaped reflective cup.

3. The LED display of claim 2, wherein said oval shaped reflective cup is longer in one direction, with said longer direction horizontally aligned.

4. The LED display of claim 1, wherein each of said at least some LED packages comprises a reflective cup with an LED, said reflective cup having side reflective surfaces arranged to match the emission characteristics of said LED.

5. The LED display of claim 1, wherein at least some of said reflective cups have body emitting LEDs with a reflective opening of 80° or more.

6. The LED display of claim 1, wherein at least some of said reflective cups have body emitting LEDs with a reflective opening of approximately 100°.

7. The LED display of claim 1, wherein at least some of said reflective cups have top emitting LEDs with a reflective opening of 60° or more.

8. The LED display of claim 1, wherein at least some of said reflective cups have top emitting LEDs with a reflective opening of approximately 80°.

9. A light emitting diode (LED) display, comprising:
a plurality of LED packages each of which has a horizontal emission angle and a vertical emission angle, wherein said horizontal emission angle is greater than said vertical emission angle in at least some of said LED packages;
wherein each of said at least some of said LED packages comprises a reflective cup with an LED, said reflective cup comprising side reflective surfaces that are higher for top emitting LEDs compared to reflective cups with similarly sized body emitting LEDs.

10. The LED display of claim 9, wherein said reflective cups with top emitting LEDs have reflective side surfaces that are more than 50% higher than reflective cups with the same sized body emitting LEDs.

11. The LED display of claim 1, wherein each of said at least some LED packages comprises an oval shaped encapsulant.

12. The LED display of claim 1, wherein each of said at least some LED packages has an encapsulant that is wider in one direction than another, the encapsulant arranged with the wider direction horizontally aligned.

13. The LED display of claim 1, wherein said each of said at least some LED packages comprises a reflective cup embedded in an encapsulant, said reflective cup arranged in said encapsulant at a point that promotes angles of emission beyond 90°.

14. The LED display of claim 1, further comprising a reflective cup heat spreader and wire bond heat spreader, each of which has thermal resistance of less than 190 K/W.

15. The LED display of claim 1, having a screen emission pattern with a horizontal far field pattern of emission greater than 90°.

16. The LED display of claim 1, having a screen emission pattern with horizontal far field pattern of emission of approximately 115°.

17. A light emitting diode (LED) package, comprising:
a lead frame at least partially embedded in an encapsulant, wherein said lead frame comprises a reflective cup with an LED, wherein said reflective cup and encapsulant are arranged to cause emission of LED light from said package with an emission angle in a first direction that is greater than the emission in a second direction;
wherein said reflective cup comprises an opening that is larger for body emitting LEDs compared to reflective cups with similarly sized top emitting LEDs.

18. The LED package of claim 17, wherein said first direction is perpendicular to said second direction.

19. The LED package of claim 17, mounted in an LED display, said first direction being horizontal and said second direction being vertical.

20. The LED package of claim 17, wherein each said reflective cup is oval shaped.

21. The LED package of claim 17, further comprising a body emitting LED in said reflective cup, said reflective cup having a reflective opening of 80° or more.

22. The LED package of claim 17, wherein said reflective cup has a reflective opening of approximately 100°.

23. The LED package of claim 17, further comprising a top emitting LED in said reflective cup, said reflective cup having a reflective opening of 60° or more.

24. The LED package of claim 17, wherein said reflective cup has a reflective opening of approximately 80°.

25. The LED package of claim 17, wherein said encapsulant is oval shaped.

26. The LED package of claim 17, wherein said encapsulant is oval shaped and is wider in a first direction compared to a direction perpendicular to said first direction, said LED package mounted in an LED display with the first direction horizontally aligned.

27. The LED display of claim 17, said each of said at least some LED packages comprises a reflective cup embedded in an encapsulant, said reflective cup arranged in said encapsulant at a point that promotes angles of emission beyond 90°.

28. A light emitting diode (LED) package, comprising:
a lead frame with a reflective cup portion with a reflective cup and an LED, said lead frame further comprising a wire bond portion, said reflective cup portion comprising a reflective cup heat spreader arranged to spread heat generated by said LED, said heat spreader sized to have a thermal resistance of less than 168 K/W.

29. The LED package of claim 28, further comprising a wire bond heat spreader integral to said wire bond portion and sized to have a thermal resistance of less than 180 K/W.

30. The LED package of claim 28, wherein said reflective cup heat spreader is sized to have a thermal resistance of less than 120 K/W.

31. The LED package of claim 29, wherein said wire bond spreader is sized to have a thermal resistance of less than 120 K/W.

32. The LED package of claim 28, further comprising an encapsulant with said lead frame embedded in said encapsulant, wherein said lead frame is patterned to provide adhesion between said encapsulant and said lead frame.

33. A light emitting diode (LED) display, comprising:
a plurality of LED packages each of which has a horizontal emission angle and a vertical emission angle, wherein said horizontal emission angle is greater than said vertical emission angle in at least some of said LED packages, wherein said LED display produces a horizontal far field pattern wider than its vertical far field pattern;
wherein each of said at least some of said LED packages comprises a reflective cup with an LED, said reflective cup comprising an opening that is larger for body emitting LEDs compared to reflective cups with similarly sized top emitting LEDs.

34. A light emitting diode (LED) display, comprising:
a plurality of pixels, each of which comprises a plurality of LED packages emitting different colors of light, each of said LED packages having a horizontal emission angle and a vertical emission angle, wherein said horizontal emission angle is greater than said vertical emission angle, the emission pattern of each of said LED packages at different vertical viewing angles within a range of viewing angles being substantially the same;
wherein at least some of said LED packages comprise a reflective cup with an LED, said reflective cup comprising an opening that is larger for body emitting LEDs compared to reflective cups with similarly sized top emitting LEDs.

35. The LED display of claim 34, wherein said range of viewing angles is 0 to 30°.

* * * * *